United States Patent [19]

Leyssens et al.

[11] Patent Number: 5,164,541

[45] Date of Patent: Nov. 17, 1992

[54] COOLING SYSTEM

[75] Inventors: François J. C. Leyssens, Mortsel; Etienne K. A. Decolvenaer, Sint-Katelijne-Waver; Paul J. E. Van Weereld, Deurne, all of Belgium

[73] Assignee: Alcatel N.V., Amsterdam, Netherlands

[21] Appl. No.: 656,052

[22] PCT Filed: Dec. 28, 1989

[86] PCT No.: PCT/EP89/01613

§ 371 Date: Feb. 15, 1991

§ 102(e) Date: Feb. 15, 1991

[87] PCT Pub. No.: WO91/10346

PCT Pub. Date: Jul. 11, 1991

[51] Int. Cl.⁵ .............................................. H01B 7/34
[52] U.S. Cl. ..................................... 174/15.2; 361/388
[58] Field of Search ................ 174/15.2; 361/381, 386, 361/388

[56] References Cited

U.S. PATENT DOCUMENTS

| | | | |
|---|---|---|---|
| 3,700,028 | 10/1972 | Noren | 174/15.2 |
| 4,019,098 | 4/1977 | McCready et al. | 174/15.2 |
| 4,120,021 | 10/1978 | Roush | 361/388 |
| 4,184,539 | 1/1980 | Rein | 361/386 |
| 4,366,526 | 12/1982 | Lijoi et al. | 361/385 |
| 4,675,783 | 6/1987 | Murase et al. | 174/15.2 |
| 4,701,829 | 10/1987 | Bricaud et al. | 361/386 |
| 4,727,455 | 2/1988 | Neidig et al. | 174/15.2 |
| 4,793,405 | 12/1988 | Diggelmann et al. | 165/104.33 |

OTHER PUBLICATIONS

"Heat Pipes" by P. Dunn and D. A. Reay; Pergamon Press; 1976; N.Y.
"Handbook of Heat Transfer Applications"; 2nd Ed. by W. M. Rohsenow, J. P. Hartnett, E. N. Ganic; McGraw-Hill Book Co.
Igram, C. G. et al.; Dendritic Wick for Heat Pipe Application; IBM Technical Disclosure Bulletin; vol. 14, No. 9, Feb. 1972; p. 2769.
Kerjilian, Q. K. et al.; Heat-Pipe Cooled Stacked Electronic Wafer Package; IBM Technical Disclosure Bulletin; vol. 18, No. 12, May 1976; p. 3982.

Primary Examiner—Morris H. Nimmo
Attorney, Agent, or Firm—Spencer, Frank & Schneider

[57] ABSTRACT

A cooling system for a plurality of circuit boards carrying heat dissipating electric components includes a network of metal rails intercoupling metal drain plates of the boards and a heat exchanger, each of the metal rails including a heat pipe.

12 Claims, 4 Drawing Sheets

COOLING SYSTEM

BACKGROUND OF THE INVENTION

1. Field of the Invention

The present invention relates to a cooling system including a plurality of circuit boards equipped with a plurality of components for dissipating heat and having a thermal drain for evacuating said heat, a heat exchanger delivering heat to a cooling medium, and means to transfer heat from the thermal drain to said heat exchanger.

2. Background Information

Such a cooling system is already known in the art, e.g. from the published European patent application 0231456 corresponding to U.S. Pat. No. 4,793,405. Therein, the means to transfer the heat from the thermal drains are integrated with the heat exchanger in a closed circuit with evaporators at the side of the thermal drains, a condensor at the side of the heat exchanger, and a network of pipes interconnecting the evaporators and the condensor.

A drawback of this known system is that a leakage in this closed circuit causes a malfunction of the whole cooling system.

SUMMARY OF THE INVENTION

An object of the present invention is to provide a cooling system of the above type but which does not present this drawback while providing an equally high or better cooling efficiency.

This object is achieved due to the fact that the heat transfer means comprise a network of mechanically and thermally intercoupled individually sealed heat conductors.

In this way, due to the fact that the heat conductors do not form part of a closed circuit but are individually sealed with respect to each other, a malfunction of an individual heat conductor does not lead to a breakdown of the whole cooling system.

Another characteristic feature of the present invention is that at least one of said heat conductors includes at least one heat pipe, which is a sealed pipe having a high thermal conductivity due to a continuous process of evaporation and condensation of a fluid taking place therein.

In this way, a high thermal efficiency of the cooling system is obtained. Such a sealed heat pipe is for instance described in the book "Heat pipes" by P. Dunn et al, published by "Pergamon Press Ltd" in 1976 and in the "Handbook of Heat Transfer Applications", second edition, by W. M. Rohsenow et al, published by McGraw-Hill Book Company, more particularly in chapter 5 thereof, pages 5-1 to 5-12.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION OF THE PREFERRED EMBODIMENT(S)

The cooling system of the present invention is useful for a telecommunication exchange for cooling electronic components which must dissipate a large amount of heat due to the high frequency of their operation and their large scale integration.

Figure 1:
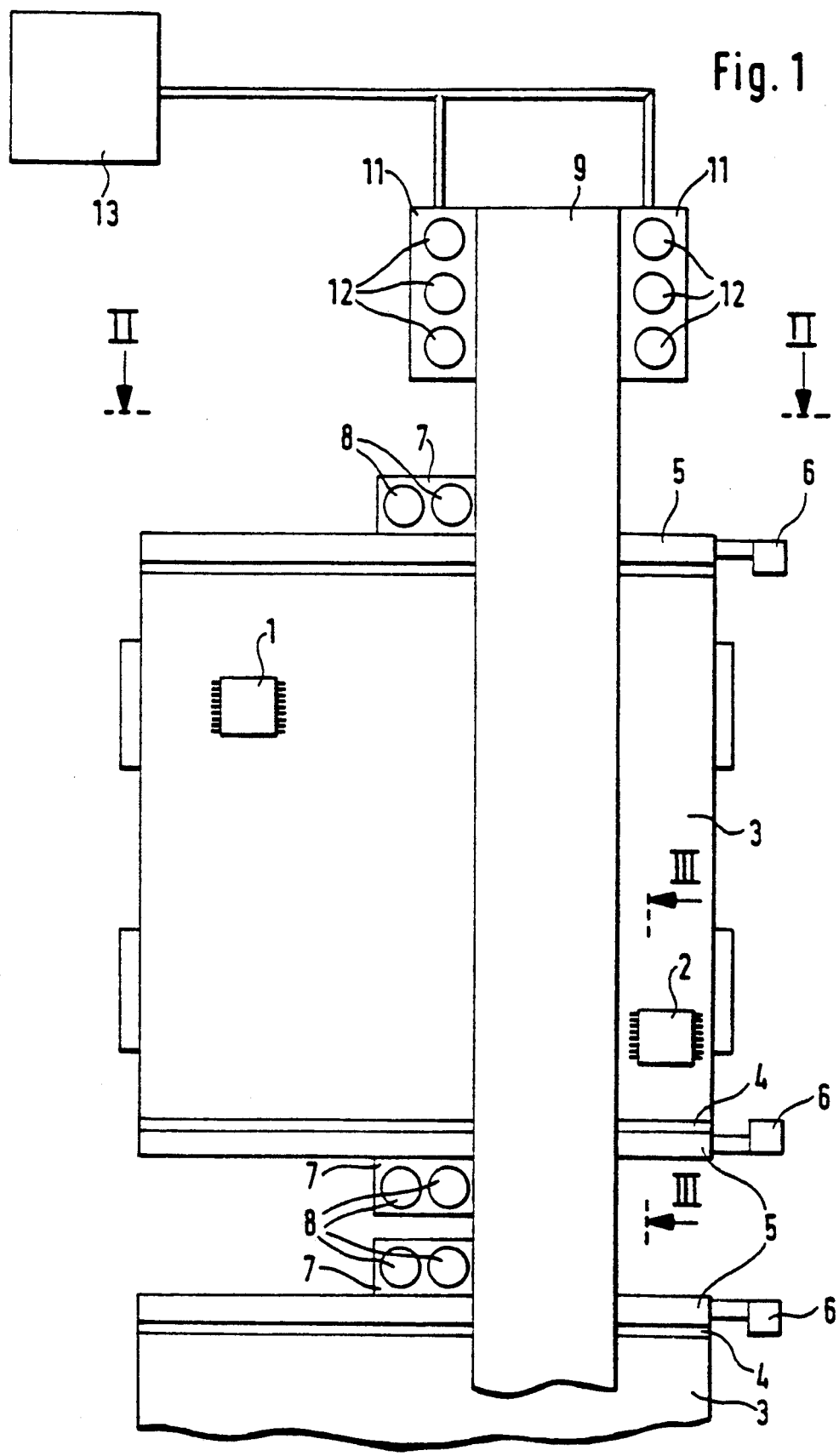
FIG. 1 is a side view of a first embodiment of a cooling system according to the invention for a plurality of parallel mounted circuit boards.
Figure 2:
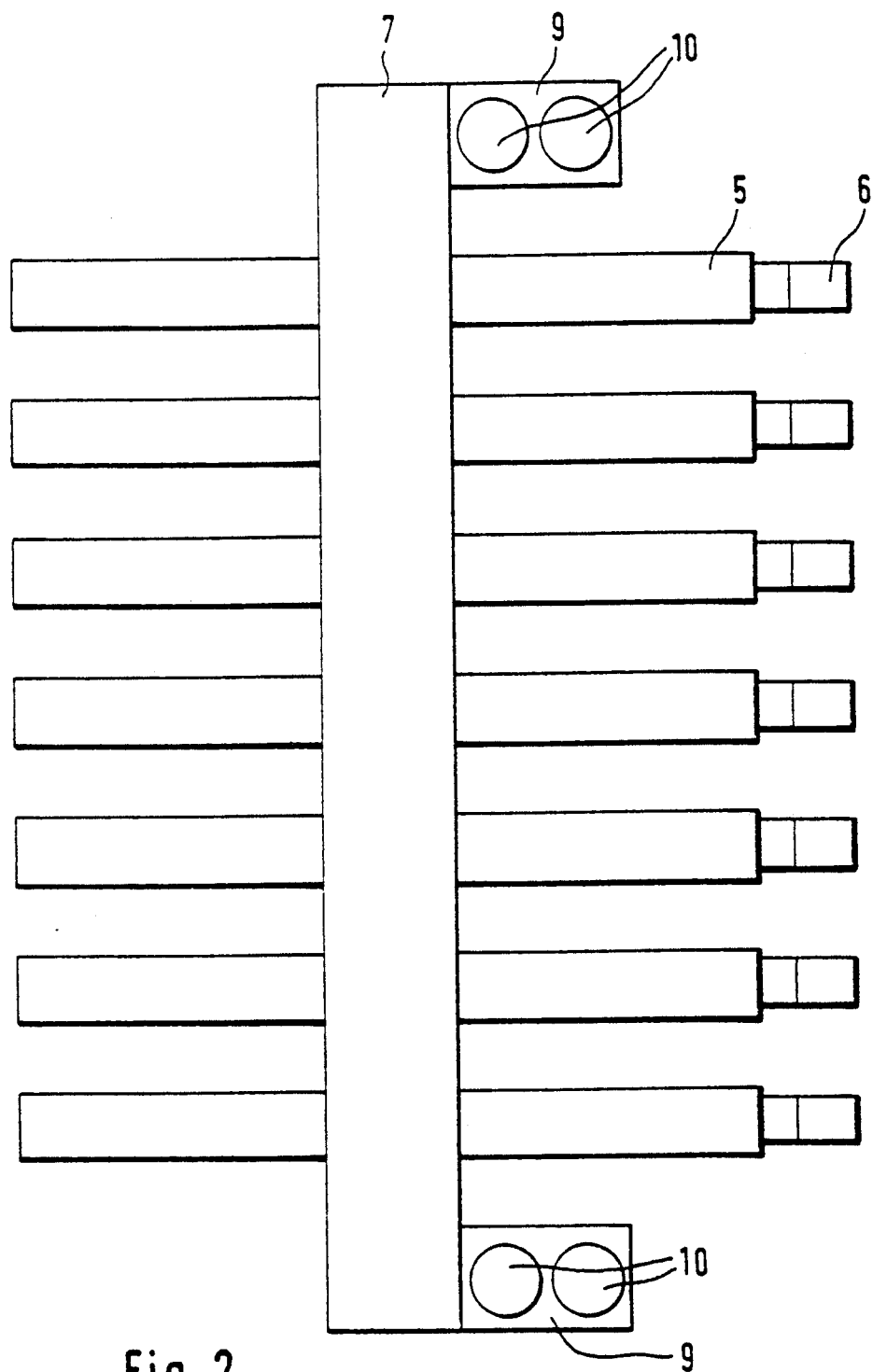
FIG. 2 is a top view in the direction of arrow II of the system of FIG. 1.

Reference is first made to FIGS. 1 and 2. FIG. 1 schematically represents a side view of two subracks of electronic circuit boards 3 mounted above each other, the lower subrack being only partially shown. FIG. 2 schematically represents a top view of the top subrack of FIG. 1 in the direction of arrow II below the dotted line. A plurality of such subracks mounted above each other form a rack, and a plurality of such racks mounted next to each other together constitute the hardware of a telecommunication exchange.

Each of the above subracks carries a plurality of parallel mounted circuit boards 3, each equipped with heat dissipating electronic components such as 1 and 2, and having an incorporated metal plate 4. This metal plate is in thermal contact with the electronic circuits and at its top and bottom it is mechanically and thermally connected—in a way described later—to metal rails 5 each provided with a handle 6. The latter are used to mechanically lock the circuit boards. The metal rails 5 further each have an internal longitudinal channel 15 (only shown in FIG. 3) wherein a heat pipe is mounted.

All the top and bottom metal rails 5 of a same subrack are mechanically and thermally interconnected by respective top and bottom horizontal metal rails 7 which are orthogonal to the metal rails 5 and wherein also heat pipes 8 are arranged.

Likewise, all the horizontal metal rails 7 of a same rack are interconnected by vertical left and right metal rails 9 carrying heat pipes 10.

Finally, all vertical metal rails 9 of a plurality of racks are interconnected by top horizontal metal rails 11 carrying heat pipes 12. The metal rails 11 are further thermally connected to a heat exchanger 13, as is schematically shown.

All the above metal rails are interconnected by screws (not shown) and together they form a framework supporting the circuit boards of the telecommunication exchange. Thermal contact between the metal rails and between the metal rails and their heat pipes is improved by the use of a thermal conductive paste or glue provided at their contact surfaces.

Due to the fact that a metal of high thermal conductivity is used for the metal rails, and because of the presence of the heat pipes and the thermally conductive paste or glue, the interconnected metal rails together also form a very efficient thermally conductive network intended to transfer the heat dissipated by the electronic components of the communication exchange to the heat exchanger 13. Indeed, the heat from the electronic components is transferred to the metal plates 4 and further conducted consecutively by metal rails 5, 7, 9 and 11 to heat exchanger 13, all metal rails being provided with highly thermally conductive heat pipes. All the heat pipes are individually sealed with respect to each other, so that malfunction of one heat pipe does not cause malfunction of the others and of the network.

Figure 3:
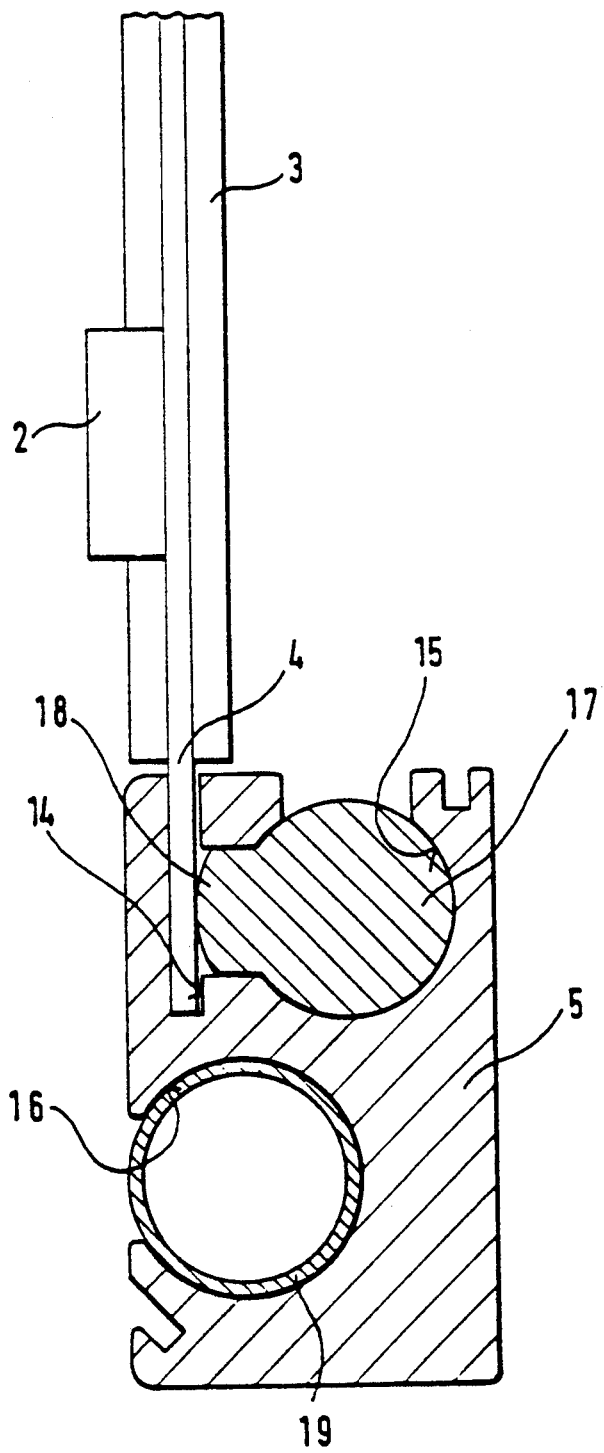
FIG. 3 is a cross-sectional view along line III—III and in the direction of the arrows of FIG. 1.

Reference is now made to FIG. 3 which shows a cross-sectional view of the bottom side of an electronic circuit board 3 and a metal rail 5. This circuit board has an incorporated metal plate 4 which is in thermal contact with the electronic components such as 2 and is used as a thermal drain to evacuate the heat dissipated by these components. The metal plate 4 protrudes from the bottom, and in an identical way (not shown) from the top of the circuit board 3 and these protruding parts are each engaged in a groove 14 of metal rail 5. To mechanically lock the circuit board and to obtain good thermal contact between the metal plate 4 and the left face of groove 14, the metal plate is pressed against this left face by a plurality of cams 18 forming part of a rod 17 which is mounted in a longitudinal channel 15 of the metal rail 5. Interruptions (not visible) in this metal rail allow angular displacement of the rod 17, so that the metal plate 4 or the board can be locked or unlocked by the cams 18. The angular displacement is done manually by means of the handle 6 mentioned above and shown in FIG. 1. A heat pipe 19 is mounted in a longitudinal channel 16 of metal rail 5.

The above mentioned thermal drain of the circuit board could also be a printed metal layer instead of a metal plate. It could also include small heat pipes embedded in the circuit board.

Figure 4:
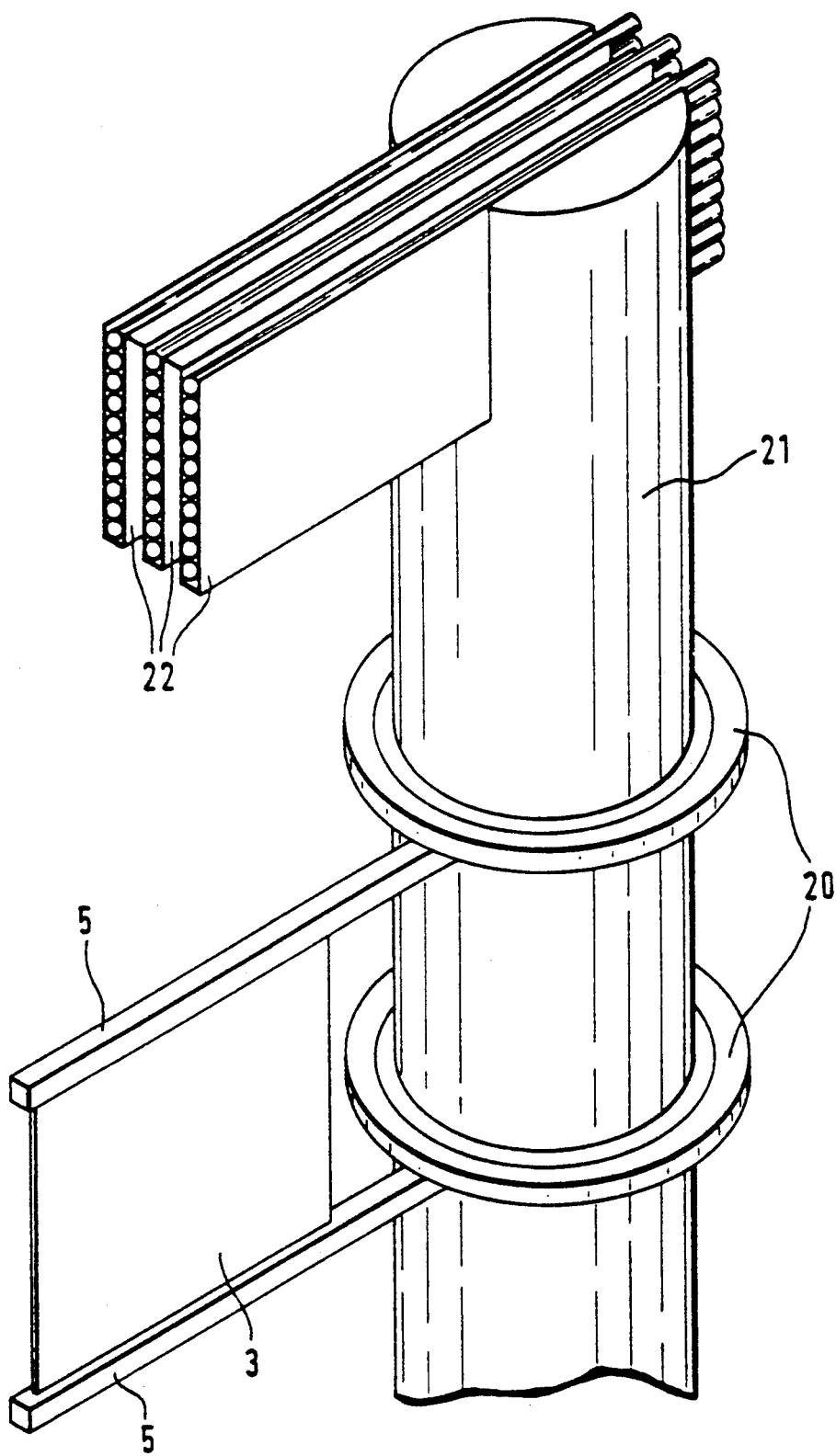
FIG. 4 is a perspective view of a second embodiment of a cooling system according to the invention for a plurality of cylindrically mounted circuit boards.

Reference is now made to FIG. 4, which shows a second embodiment of a cooling system, i.e. one for cooling circuit boards mounted in a cylindrical configuration. However, in the figure only one circuit board 3 is shown. This circuit board 3 is identical to the ones described above and has similar metal rails 5. From a plurality of such metal rails 5 heat is further transferred to circular metal rails 20 provided with internal heat pipes (not visible) and then to a heat pipe 21 which is centrally located in the rack. The central heat pipes of a plurality of racks 21 are interconnected by metal rails 22 which also have internal heat pipes and which are connected to a heat exchanger (not shown).

The heat exchanger could also be located in the center of each rack, in direct contact with the metal rails 22.

It should be noted that an advantage of a cylindrical configuration of circuit boards over to a rectangular configuration is that it allows shorter electrical interconnections to be used between the these boards in the center of the cylindrical configuration.

While the principles of the invention have been described above in connection with specific apparatus, it is to be clearly understood that this description is made only by way of example and not as a limitation on the scope of the invention.

We claim:

1. A cooling system comprising:
a plurality of circuit boards equipped with a plurality of components dissipating heat and having a thermal drain for evacuating said heat;
a heat exchanger delivering heat to a cooling medium; and
means for transferring heat from said thermal drain to said heat exchanger, said means for transferring heat comprising a network of mechanically and thermally inter-coupled individually sealed heat conductors;
wherein said network includes at least one first heat conductor per circuit board in thermal contact with said thermal drain and at least one second heat conductor inter-connecting said first heat conductors and linking them to said heat exchanger.

2. The cooling system according to claim 1, wherein said at least one heat conductor includes at least one heat pipe, which is a sealed pipe having high thermal conductivity due to a continuous process of evaporation and condensation of a fluid taking place therein.

3. The cooling system according to claim 2, wherein said at least one heat conductor including said at least one heat pipe consists of a metal rail provided with a channel wherein said at least one heat pipe is mounted.

4. The cooling system according to claim 3, wherein contact surfaces of said metal rails and of said heat pipes are formed by a thermally conductive paste or glue.

5. The cooling system according to claim 1, wherein said network also constitutes a framework for mechanically supporting said circuit boards.

6. The cooling system according to claim 1, wherein said thermal drain is constituted by at least one metal plate or printed metal layer in thermal contact with said components.

7. The cooling system according to claim 1, wherein said thermal drain includes a plurality of heat pipes embedded in said circuit boards and in thermal contact with said components.

8. The cooling system according to claim 1, wherein said circuit boards are parallel to each other.

9. The cooling system according to claim 1, wherein said circuit boards are so mounted that they form a cylindrical configuration in the center of which at least one of said second heat conductors is located.

10. A cooling system comprising:
a plurality of circuit boards equipped with a plurality of components dissipating heat and having a thermal drain for evacuating said heat;
a heat exchanger delivering heat to a cooling medium; and
means for transferring heat from said thermal drain to said heat exchanger, said means for transferring heat comprising a network of mechanically and thermally inter-coupled individually sealed heat conductors;
wherein said at least one heat conductor includes at least one heat pipe, which is a sealed pipe having high thermal conductivity due to a continuous process of evaporation and condensation of a fluid taking place therein;
wherein said at least one heat conductor including said at least one heat pipe consists of a metal rail provided with a channel wherein said at least one heat pipe is mounted; and
wherein said at least one metal rail is provided per circuit board and mechanically supports said board, said at least one metal rail being provided with a groove wherein said thermal drain is engaged.

11. The cooling system according to claim 10, wherein contact surfaces of said metal rails and of said heat pipes are formed by a thermally conductive paste or glue.

12. A cooling system comprising:
a plurality of circuit boards equipped with a plurality of components dissipating heat and having a thermal drain for evacuating said heat;
a heat exchanger delivering heat to a cooling medium; and
means for transferring heat from said thermal drain to said heat exchanger, said means for transferring heat comprising a network of mechanically and thermally intercoupled individually sealed heat conductors;
wherein contact surfaces of said heat conductors are formed by a thermally conductive paste or glue.

* * * * *